United States Patent [19]

Satomura

[11] 4,053,415

[45] Oct. 11, 1977

[54] UNSATURATED POLYESTER ETHER HAVING A PHOTOCROSSLINKABLE MOIETY

[75] Inventor: Masato Satomura, Fujimiya, Japan

[73] Assignee: Fuji Photo Film Co., Ltd., Ashigara, Japan

[21] Appl. No.: 647,671

[22] Filed: Jan. 9, 1976

[30] Foreign Application Priority Data

Jan. 9, 1975 Japan .................................. 50-5177

[51] Int. Cl.$^2$ ............................................. C08G 63/66
[52] U.S. Cl. .................. 204/159.19; 96/35.1; 96/115 R; 204/159.18; 260/47 UA
[58] Field of Search ............ 260/47 UA; 204/159.19; 96/115 R

[56] References Cited

U.S. PATENT DOCUMENTS

| | | | |
|---|---|---|---|
| 3,445,545 | 5/1969 | Skoultchi | 260/881 |
| 3,594,348 | 7/1971 | Maar et al. | 260/47 UA |
| 3,622,320 | 11/1971 | Allen | 96/28 |
| 3,726,685 | 4/1973 | Philpot et al. | 96/86 P |
| 3,775,112 | 11/1973 | Alsup et al. | 96/28 |
| 3,873,500 | 3/1975 | Kato et al. | 260/47 UA |
| 3,947,337 | 3/1976 | Peters et al. | 204/159.15 |

*Primary Examiner*—Lucille M. Phynes
*Attorney, Agent, or Firm*—Sughrue, Rothwell, Mion, Zinn and Macpeak

[57] ABSTRACT

A polyester ether containing in its main chain the moiety represented by the formula:

$$-R_2OArR_3COO-$$

wherein Ar is an arylene group, $R_2$ is an alkylene group or an oxaalkylene group, and $R_3$ is a vinylene group, a butadienylene group or a vinylene or a butadienylene group substituted by one or more groups containing not more than 6 carbon atoms. A light-sensitive composition containing the above polyester ether is also disclosed.

12 Claims, No Drawings

UNSATURATED POLYESTER ETHER HAVING A PHOTOCROSSLINKABLE MOIETY

BACKGROUND OF THE INVENTION

1. Field of the Invention

The present invention relates to compounds containing internal unsaturated bonds, more particularly, to polyester ethers.

2. Description of the Prior Art

Hitherto, those compounds containing unsaturated bonds adjacent an aromatic rings, e.g., compounds containing a styryl group or a benzal group, have been widely investigated because of their unique reactivity based on their long conjugated units.

In particular, those compounds containing electron attracting groups at the β-position have been widely studied with respect to polymerizability, photoreactivity, e.g., crosslinking, isomerization, ultraviolet ray filtering functions, etc., chemical reactivity, e.g., amenability to addition reaction, halochromy, etc. Many patents and papers deal with such materials reported, for example, in French Pat. No. 1,482,302, U.S. Pat. No. 2,768,077, Cope, *J. Am. Chem. Soc.*, 63 3452 (1941), Cromwell, *J. Org. Chem.*, 14 411 (1949), Lutz, *J. Am. Chem. Soc.*, 72 4090 (1950), Cohen, *J. Chem. Soc.*, 1964 2,000, Kreisel, *J. Poly. Sci.*, Part A 105 (1964), Schmidt, *J. Chem. Soc.*, 1967 229 to 239, Forward, *J. Chem. Soc.*, Part-C 1969 1868, Hocking, *Can. J. Chem.*, 1969 4567, Marx, T.L., 1971 4957, Whiting, *J. Chem. Soc.*, Part-C 1971 3396, Miller, *J. Am. Chem. Soc.*, 94 3912 (1972), etc.

Furthermore, attempts to produce reactive polymers by providing the characteristics shown by the above low molecular weight compounds to a polymer chain have been made. For example, polymer compounds represented by the formula shown below have been produced from polystyrene, and, in addition, a number of polymer compounds have been synthesized and investigated for photoreactivity, i.e., photocrosslinking capability and photoconductivity.

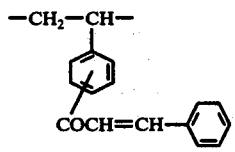

See, for example, U.S. Pat. Nos. 3,257,664, 3,357,831, 3,409,593, 3,418,295, 3,647,447, 3,647,470, 3,737,319, 3,677,754, 3,697,072, 3,748,131, 3,748,144, 3,761,280, 3,767,415, 3,779,989, 2,835,656, British Pat. No. 964,877, J. Kosar, *Light Sensitive Systems*, John Wiley & Sons, New York (1965), etc.

These investigations have all been directed to introducing internal unsaturated bonds utilizing a polymer reaction.

In this case, however, since the reactions involved are those of polymers, that is, where reactive groups are introduced into polymer compounds, difficulties are encountered in selecting solvents, setting temperatures, and determining the time and amount of the solvent to be applied, etc.

Furthermore, polymer reactions suffer from the defect that the reaction conversion is difficult to increase. In addition, the reaction products isolated are colored, and, thus, operations such as purification, reprecipitation, etc., are required. The reactive polymer compounds obtained also suffer from the defect that it is difficult to modify their reactivity, solubility, film-forming properties, etc., because these properties depend greatly on the characteristics of the polymer compounds initially used (see, for example, E. M. Fettes, *Chemical Reactions of Polymers*, Interscience Pub., New York (1964), Iwakura et al., *Kindai Kogyo Kagaku* (*Modern Industrial Chemistry*), Vol. 16, Part A, on and after page 369, Asakura Shoten, Tokyo (1966), etc.).

Attempts to produce reactive polymers by subjecting addition-polymerizable monomers containing the above internal unsaturated bonds to ionic polymerization or free radical polymerization have been made (see, for example, R. Hart, *Markromol, Chem.*, 37 47 (1960), G. Smetz, *Makromol, Chem.*, 60 89 (1963), Kawai, *Kogyo Kagaku Zassi* 73 2356 (1970), Kato, *J. Poly. Sci.*, 13 605 (1969), ibid., *J. Poly. Sci.*, A-9 2109 (1971), U.S. Pat. Nos. 3,409,593, 3,453,110, 3,445,545, 3,737,319, 3,770,443, 3,799,915, 3,804,628, British Pat. Nos. 1,231,822, 1,350,516, Japanese Pat. Nos. 48216/1968, 22513/1971, 33074/1972, Japanese Pat. Nos. (OPI) 34794/1972, 55279/1973, 15501/1974, 36794/1974, 38987/1974, etc.).

These methods of producing reactive polymers by utilizing vinyl polymerization reactions have the various problems shown below.

1. The polymerization is liable to be disturbed, and sometimes is substantially inhibited, by moisture (water).
2. If there is present a compound containing an active hydrogen group, e.g., an alcohol, amine, and the like, polymerization is prevented, or a chain transfer reaction takes place with ease, thereby making it difficult to obtain a polymer product.
3. If the polymerization temperature is not maintained at low temperature, e.g., −35 to −78° C, polymerization is sometimes prevented.
4. With an increase in reaction temperature, side reactions take place.
5. Purification of the compounds used is indispensable.
6. Extremely small amounts (on the order of ppm) of impurities. e.g., quinones, sometimes prevent polymerization.
7. In general, polymerization is exothermic, and side reactions are liable to take place due to local heating.
8. Mass production and continuous production are quite difficult.
9. Since the monomer contains two active groups, cross due to side reactions (gellation) takes place.
10. The presence of small amounts of unreacted compounds is inevitable.
11. Reproducibility is poor and molecular weight is liable to change.

As one method of overcoming these disadvantages inherent to the polymer reaction and the vinyl polymer reaction, a polycondensation reaction can be used.

Most polycondensation reactions utilized in the synthesis of reactive polymers comprise reacting dibasic acids or active derivatives thereof, e.g., esters, acid halides, anhydrides, or the like, with compounds containing two active hydrogens, e.g., diols, alkanolamines, diamines, and the like (see, for example, U.S. Pat. Nos. 3,173,787, 3,453,237, 3,622,320, 3,640,722, 3,647,444, 3,674,745, 3,707,373, 3,726,685, 3,761,250, 3,761,280, 3,775,112, German Pat. Nos. 1,099,732, 1,182,061, 1,229,388, 1,547,794, German Pat. No. (OLS) 2,012,390, British Pat. No. 1,197,182, L. R. Williams, J.A.P.P.S., 15 513, etc.).

These polycondensation reactions, however, suffer from various problems. For example, no high molecular weight polymer is obtained unless dibasic acids and diols are added in equimolar amounts. For this reason, a process is generally used in which diols are used in excess to the acids or esters, and the diols are distilled off from the reaction system as the reaction proceeds so that an equimolar relation is reached, as is well known in processes for obtaining polyethylene terephthalate.

However, even in the case of a diol having the lowest boiling point, i.e., ethylene glycol, its boiling point is about 200° C, and to distil of the ethylene glycol from the system, heating at high temperatures for a long period of time is required. Furthermore, there are the problems that the starting materials, especially the acid component, are of high crystallinity and of a high melting point. For example, a representative unsaturated acid used in U.S. Pat. No. 3,622,320 is paraphenylenediacrylic acid having a melting point of higher than 300° C.

It can be forecast, therefore, that those polyesters produced from dibasic acids having a high melting point are highly crystalline and hard. Such crystallinity, however, is inconvenient in a field where compatibility with tackifiers and additives, solubility, and dyeability are required.

In order to overcome these disadvantages of polyesters produced from dibasic acids of a high melting point, attempts to incorporate dibasic acids of a low melting point as a third component have been made. In U.S. Pat. No. 3,775,112, for example, dibasic acids having a melting point of about 150° C, e.g., azelaic acid, adipic acid, sebacic acid, or the like, are added as third components to decrease the crystallinity of the polyesters obtained, U.S. Pat. No. 3,622,320 also describes adding these low melting point third components in an amount of 12.5 to 42.5 mol% based on the acid component. Even though subjected to such modifications, the polyesters obtained suffer from the defect that they are highly crystalline.

With polymers of such crystallinity, there is a fair possibility of crystallization proceeding due to variations with time during the storage thereof, thereby reducing their compatibility with adhesive additives and their transparency, etc., as a result of which the polymers become brittle. Therefore, in fields in which adherence, compatibility, and affinity are required, e.g, for use as films, adhesives, yarn, filaments, printing plates, compositions, etc., these polymers are used only with difficulty.

In addition, using phenylenediacrylic acid suffers from the disadvantages that phenylenediacrylic acid is not easily available on the market and is high in cost, and that since there is no suitable solvent for recrystallization, purification thereof is difficult.

Furthermore, as is well known in the field of reactive polymers, between the units (C) of reactive units in the polymer compound and the reactivity thereof (S: photocrosslinking capability), there is the relationship that S is almost proportional to the square of C (see, for example, C. C. Unruh, *J. Appl. Poly. Sci.*, 2 358 (1959), M. Thuda, *J. Poly. Sci.*, A-2 2911 (1964), etc.).

From this relationship, it can be forecast that a decrease in the phenylenediacrylic acid present (corresponding to (C)) will cause a sudden reduction in the reactivity of the polyester, and thus suitability thereof as a material for a printing plate, relief image, and the like is lost.

Therefore, a reduction in crystallinity by the addition of third components as described in the above patents is attended by a decrease in the most important feature of reactivity, which is quite disadvantageous.

As a result of the inventor's research on the above points, the use of compounds containing two kinds of reactive groups, one being a cinnamic acid skelton of high reactivity and the other being a skelton capable of forming a polyester ether on application of one stage processing, e.g., heating, an ester exchange reaction, treatment with a base, etc., has been discovered. That is, the use of compounds containing two kinds of reactive groups enables the above problems encountered in producing polyesters from dibasic acids to be overcome. Furthermore, it has been found that the use of such compounds provides polymers of any desired degree of crystallinity as necessary. In addition, the production of polyester ethers comprising only the above component (C) becomes possible, and a considerable improvement in the reactivity of the polyester ethers obtained is achieved.

SUMMARY OF THE INVENTION

One object of the present invention is to provide polyester ethers.

Another object of the present invention is to provide polyester ethers containing compounds which contain double bonds adjacent an aromatic ring.

A further object of the present invention is to provide amorphous polyester ethers, if desired.

Still another object of the present invention is to provide crystalline polyester ethers, if desired.

Another object of the present invention is to provide materials capable of providing any degree of crystallinity by suitably selecting combinations of reactants.

Another object of the present invention is to provide polyester ethers containing one reactive group per polyester ether condensation unit.

Another object of the present invention is to provide materials which can be industrially produced with ease.

Another object of the present invention is to provide polyester ethers of good compatibility with additives.

Another object of the present invention is to provide polyester ethers of a low glass transition point.

Another object of the present invention is to provide reactive polyester ethers.

Another object of the present invention is to provide polyester ethers which are curable, if desired.

Another object of the present invention is to provide photocrosslinkable polyester ethers, if desired.

Another object of the present invention is to provide polyester ether materials capable of providing polyhalides by the addition of halogen atoms.

Another object of the present invention is to provide polyester ethers of good dyeability.

Another object of the present invention is to provide polyester ether materials which can be stretched.

It has been found that the above objects are attained by using the compounds as described below.

$$R_1OCOR_2OArR_3COX \qquad \text{(III-1)}$$

$$R_1OR_2OArR_3COX \qquad \text{(III-2)}$$

-continued

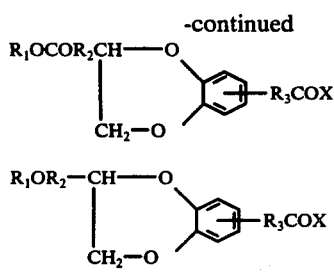

XCOR₃ArOR₂OArR₃COX (V)

R₁OR₂OArR₃COOR₂OCOR₃ArOR₂OR₁ (VI)

wherein $R_1$ is hydrogen or an acyl group; $R_2$ is an alkylene group, an oxyalkylene group; $R_3$ is a vinylene, butadienylene, or vinylene group substituted by groups containing 6 or less carbon atoms; Ar is a divalent aromatic arylene group; X is halogen or $OR_4$; and $R_4$ is hydrogen, a metal atom or an aliphatic or aromatic group containing 8 or less carbon atoms.

The present invention is thus characterized in that compounds containing at least one double bond and two ester-forming groups are used as starting materials.

DETAILED DESCRIPTION OF THE INVENTION

Particularly suitable ester-forming groups include:

1. a carboxy group or functional derivative thereof such as an ester or acid halide and the like
2. hydroxy or functional derivative thereof such as acyloxy and the like.

In more detail, the following can be used.

Formula III

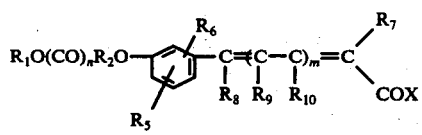

wherein $R_1$, $R_2$, and X are as defined above, $R_5$ and $R_6$ are hydrogen, halogen, alkyl, alkoxy, acyl, nitro, or a group containing 12 or less carbon atoms, $R_5$ and $R_6$ may combine with each other to form a 5- or 6-membered ring, $R_7$ is selected from the group of hydrogen, cyano, carbamoyl, alkyl, allyl, allyloxy, and alkoxy, $R_8$, $R_9$, and $R_{10}$ are hydrogen, alkyl, or aryl, and $n$ and $m$ are 0 or 1.

Formula IV

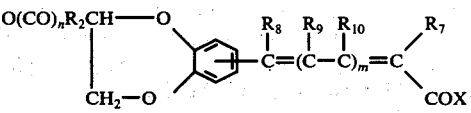

wherein $R_1$, $R_2$, $R_7$, $R_8$, $R_9$, $R_{10}$, X and $n$ are the same as defined above Formula V

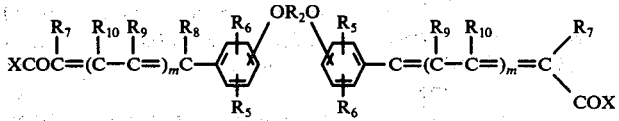

wherein $R_2$, $R_5$, $R_6$, $R_7$, $R_8$, $R_9$, $R_{10}$, X, and $m$ are the same as defined above.

Formula VI

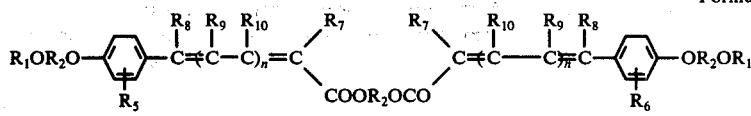

wherein $R_2$, $R_4$, $R_5$, $R_6$, $R_7$, $R_8$, $R_9$, $R_{10}$, X, and $n$ are the same as defined above.

Each moiety will be described in detail hereinbelow.

$R_1O(CO)_nR_2O$— is a group wherein the total number of carbon atoms is about 15. This group includes those containing a hydroxy group or acyloxy group, e.g., hydroxyethoxy, 4-hydroxybutoxy, 2-hydroxymethylisopropoxy, 4-hydroxymethylcyclohexylmethyleneoxy, 3-hydroxypropoxy, 2-hydroxypropoxy, β-hydroxyethoxyethyloxy, γ-hydroxypentyloxy, formyloxyethyloxy, formyloxypropoxy, acetyloxyethoxy, acetyloxypropoxy, benzoyloxyethoxy, formyloxypentyloxy, and the like.

$R_2$ is a straight, branched or cyclic alkylene group containing 1 to about 10 carbon atoms, which may contain an ether bond or be substituted with an allylene group. Examples of $R_2$ are —$CH_2$—, —$CH(CH_3)$—, —$(CH_2)_2$—, —$(CH_2)_3$—, —$(CH_2)_4$—, —$CH_2CH(CH_3)$—, —$(CH_2)_2O(CH_2)_2$—, —$CH(C_2H_5)CH_2$—,

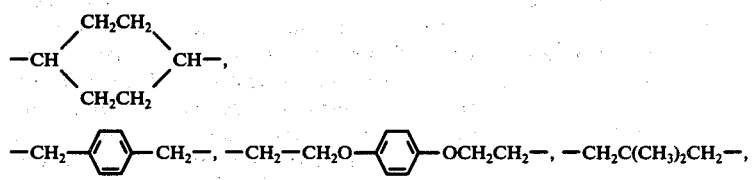

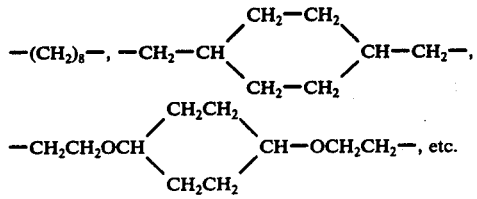

R$_4$ indicates a hydrogen atom or a metal atom, e.g., hydrogen, sodium, potassium, lithium, magnesium, and the like, or those groups containing not more than about 8 carbon atoms, e.g., methyl, isopropyl, t-butyl, t-octyl, phenyl, chlorophenyl, and the like.

R$_5$ and R$_6$ indicate a hydrogen atom, a halogen atom, e.g., chlorine, bromine, fluorine, a hydroxy group, a nitro group, methyl, ethyl, t-butyl, t-amyl, allyl, methoxy, ethoxy, propoxy, phenoxy, benzyloxy, dimethylamino, dimethylaminoethyl, cyano, acetyl, benzoyl, aryl such as phenyl, benzyl, formylamido, acetamide, and the like. Of these, a hydrogen atom, a methoxy group, and the like are particularly preferred. R$_5$ and R$_6$ may combine with each other to form a saturated or unsaturated 5- or 6-membered ring consisting of non-metal atoms.

X indicates a halogen atom, e.g., chlorine, bromine, and the like, or —OR$_4$, wherein R$_4$ is as earlier defined.

The compounds represented by Formule (III) to (IV) are generally produced by the reaction of an aromatic aldehyde with groups capable of participating in the ester bond and active methylene compounds (including active methyl compounds). Most representative reaction schemes to obtain a hydroxyethoxycinnamic acid methyl ester are as follows:

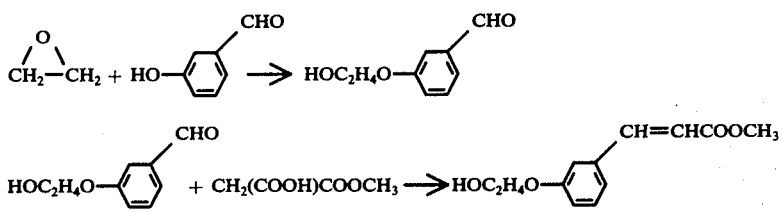

In this case, as starting materials, hydroxyarylaldehydes, e.g., salicylaldehyde, vanillin, and the like are particularly advantageously used. Thus these compounds will be described in detail.

Hydroxyarylaldehydes commercially available on the market include 3-hydroxy-p-anisaldehyde, 3-hydrox-ybenzaldehyde, 4-hydroxybenzaldehyde, 2-hydroxy-4-methoxybenzaldehyde, 2-hydroxy-5-methoxybenzaldehyde, 2-hydroxy-1-naphthoaldehyde, 1-hydroxy-2-naphthoaldehyde, 3-hydroxy-4-nitrobenzaldehyde, 4-hydroxy-3-nitrobenzaldehyde, 5-hydroxy-2-nitrobenzldehyde, 5-iodovannillin, 5-nitrovanillin, salicylaldehyde, vanillin, o-vanillin, 2,5-dihydroxybenzaldehyde, 3,4-dihydroxybenzaldehyde, 3,5-dimethoxy-4-hydroxybenzaldehyde, 4,6-dimethoxysalicylaldehyde, 3-ethoxy-4-hydroxybenzaldehyde, 3-hydroxy-4-methoxybenzaledehyde, etc.

Operations such as chlorination, nitration, alkoxylation, acyloxylation, alkylation, acylation and the like are carried out in a conventional manner, and, needless to say, those compounds with such groups introduced therein can be advantageously used. Of these compounds, hydroxybenzaldehyde and methoxyhydroxybenzaldehyde are preferred from the viewpoint of their availability as starting materials.

The phenolic hydroxy groups of these hydroxy group-containing aromatic aldehydes are inactive to the ester bond-forming reaction. Thus, these hydroxyarylaldehydes are reacted with epoxides, halohydrins, alkylene carbonates, dioxolans, acetals, ketals, and the like so as to convert them into the corresponding compounds containing aliphatic hydroxy groups.

Epoxides which are advantageously used in the present invention include those containing 2 to about 10 carbon atoms, e.g., ethhylene oxide, propylene oxide, butylene oxide, hexene oxide, octene oxide, cyclohexane oxide, ehtyl glycidyl ether, butyl glycidyl ether, phenyl glycidyl ether, styrene oxide and the like.

Alkylene carbonates and dioxolans include the carbonates and the like of the above epoxides, e.g., ethylene carbonate, propylene carbonate, butylene carbonate, and the like.

Halohydrins which are advantageously used in the present invention, include those containing 2 to about 15 carbon atoms, e.g., ethylene chlorohydrin, ethylene bromohydrin, propylene bromohydrin, bromoethoxyethanol, ω-bromohexanol, ω-bromobutanol, ω-bromo-3,6-dioxaoctanol and the like.

Methods of reacting phenolic hydroxy groups and these reagents, e.g., epoxides or halohydrins, are well known, and such conventional methods are used in the present invention. Such reaction techniques are conventional in the art; usually the reagents are used in an amount of about 1.0 to about 1.2 moles per mole of the phenolic compound.

The thus obtained aliphatic hydroxy group-containing arylaldehydes can be esterified, as desired, with acids, acid halides, anhydrides, and the like. In the esterification, low molecular weight acid halides annd anhydrides, e.g., ethoxycarbonyl chloride, acetyl chloride, acetic anhydride, formic acid-acetic acid anhydride, succinic anhydride, maleic anhydride, phthalic anhydride, and the like can be used.

The above aliphatic hydroxy group-containing aromatic aldehydes include o-hydroxyethoxybenzaldehyde, p-ω-hydroxypropoxybenzaldehyde, m-hydroxyethyloxybenzaldehyde, p-hydroxyethyloxybenzaldehyde, p-hydroxyethyloxydichlorobenzaldehyde, 3-hydroxyethoxy-5-chlorobenzaldehyde, m-hydroxyethoxy-p-methoxybenzaldehyde, 3-hydroxyethoxy-4-chlorobenzaldehyde, 3-hydroxyethoxy-4-ethoxybenzaldehyde, 5-ethoxy-3-hydroxyethoxybenzaldehyde, o-hydroxyethoxy-m-methoxybenzaldehyde, 3-ethoxy-4-hydroxyethoxybenzaldehyde, 2-hydroxyethoxy-6-naphthoaldehyde, 2-hydroxymethyl-6 or 7-formyl-1,4-benzoxane, 3-formylphenoxyethyl acetate, β-(4-formylphenoxy)ethylformate, β-(5-formyl-2-methoxy-phenoxy)ethyl acetate, β-(2,6-dimethoxy-4-formylphenoxy)ethyl acetate, p-hydroxybutoxybenzaldehyde, o-ω-hydroxy-3-oxapentyloxybenzaldehyde, diethylene glycol-mono-4-formyl phenyl ether, γ-(4-formylphenoxy)-propyl acetate, β-(3-formylphenoxy)propyl acetate, 2-hydroxyethoxy-5-methoxybenzaldehyde, 4-ethoxy-2-hydroxyethoxybenzaldehyde, 4-chloromethyl-3-propoxybenzaldehyde, β-methacryloxyethyl-4-formyl phenyl ether, β-acryloxypropyl-3-formyl phenyl ether, 3-formylphenoxytriethyleneoxy acetate, p-hydroxypropyloxybenzaldehyde, triethyleneglycol mono-p-formylphenyl ether, etc.

Of these compounds, as described above, hdroxyarylaldehydes can be advantageously used as starting materials in that they are commercially available at low price.

In producing crystalline polyesters as ester, it is convenient to use those compounds in which reactive groups are positioned at the para-position. Crystallinity, however, can be reduced by selecting the position of the aliphatic group in the polyester ether.

In producing amorphous polyester ethers, those compounds containing reactive groups at the meta- or ortho-position give good results.

For example, in the case of films and yarns, those of high crystallinity are preferred, whereas in the case of printing plates, adhesives, paints and molding materials, those of low crystallinity are preferred.

For instance, with an -OAr- moiety, those containing

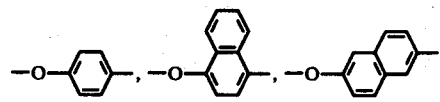

and the like are high in crystallinity as compared with those containing 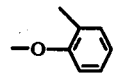

The reaction between an aromatic aldehyde containing groups capable of participating in the ester bond and an active methylene compound is well known as the Perkins reaction, the Knoevenagal reaction or the Doebner reaction. The active methylene compounds include esters, amides, and the like, e.g., malonic acid, malonic acid esters, acetic acid, cyanoacetate, acetoacetate, acrolein, crotonic acid, and the like.

As catalysts for use in the condensation reaction, pyridine, piperidine, pipecoline, lupetidine, N-methyl-piperidine, piperazine, morpholine, N-methylmorpholine, dimethylaniline, diethanolaniline, quinoline, sodium alkoxides, potassium t-butoxide, sodium carbonate, potassium carbonate, triethylamine, acetic acid, titanium tetrachloride, anhydrous acetic acid, and the like can be used singly or in combination with each other (with regard to how to use these reagents, see, for example, Kotake et al., *Jikken Kagaku Koza* (18*II*), Maruzen, Tokyo (1943)). Where metals are used, it is particularly advantageous to keep the reaction system dry.

Where solvents and reaction accelerators are used, it is preferred to add them in small amounts, that is, the amount of these materials are limited from the viewpoint of ease of separation of the products. Adjustment of the concentration of the product to not less than 3%, preferably not less than 10%, in the reaction system at the completion of the condensation gives good results.

Representative examples of polyester ether materials containing internal unsaturated bonds for use in the method of the present invention are shown below.

1. m-β-Hydroxyethoxycinnamic acid
2. m-Methoxy-p-β-hydroxyethoxycinnamic acid
3. p-Methoxy-m-γ-hydroxypropoxycinnamic acid
4. p-Chloro-m-β-hydroxyethoxycinnamic acid
5. o-β-Hydroxyethoxycinnamic acid
6. 1-Hydroxymethyl-3,4-(5 or 6-β-carboxyvinyl)benzodioxane
7. 1-Chloromethyl-3,4-(5 or 6-β-carboxyvinyl) benzodioxane
8. 4-β-Acetoxyethoxycinnamic acid
9. 3-β-Formyloxyethyloxycinnamic acid
10. o-β-Acetoxyethyloxycinnamic acid
11. m-Hydroxyethoxycinnamic acid methyl ester
12. Succinic acid half ester of p-β-hydroxyethoxycinnamic acid
13. p-δ-Oxybutoxycinnamic acid
14. 3,5-Dimethoxy-4-(5-oxy-3-oxapentoxy)cinnamic acid
15. o-ω-Acetoxybutoxycinnamic acid
16. 2-Methoxy-5-(5-oxy-3-oxapentoxy)cinnamic acid
17. 3-Hydroxypropoxycinnamic acid
18. 2,5-Dimethyl-4-β-hydroxyethoxycinnamic acid
19. o-β-Hydroxypropoxycinnamic acid
20. 2-β-Hydroxyethoxy-5-nitrocinnamic acid
21. 2-β-Hydroxyethoxy-3-chloro-5-nitrocinnamic acid
22. m-γ-Hydroxypropoxycinnamic acid
23. m-Ethoxy-p-β-hydroxyethoxycinnamic acid
24. m-β-Hydroxypropoxycinnamic acid
25. Methyl-m-(9-oxy-1,4,7-trioxa)nonyloxycinnamate
26. 3,5-Dichloro-4-β-hydroxyethoxycinnamic acid
27. m-Chloro-4-β-hydroxyethoxycinnamic acid chloride
28. 4-Hydroxypropoxycinnamic acid chloride
29. Ethyleneglycol-mono(p-β-hydroxyethoxy)cinnamate
30. 2-β-Hydroxyethyl-6-β-methoxycarbonylvinyl naphthalene
31. 4-(p-β-Hydroxyethoxyphenyl)butadiene-1-carboxylic acid Compounds as used herein generally contain two kinds of reactive groups, and are capable of providing polyester ethers in a one-stage reaction.

Compounds which have a similar skeleton to the above compounds and which are also capable or providing the polyester ether of the present invention include the following compounds:

32. 1,2-bis-4-(β-Carboxyvinyl)phenoxyethane
33. 1,2-bis-p-(β-Hydroxyethoxy)cinnamoyloxyethane
34. 1,2-bis-p-Hydroxybutoxycinnamoyloxyethane
35. 1,3-bis-p-Carboxyvinylphenoxypropane
36. 1,4-bis(p-β-Hydroxyethoxycinnamoyloxy)butane The above compounds are represented by earlier presented Formulae (V) and (VI).

Those materials for use in the present invention are further purified with ease.

The method of the present invention is simple in operation, and, thus, removal of impurities, e.g., unreacted compounds, by-products, and the like, is unnecessary or very easy.

Since the method of the present invention is carried out under mild reaction conditions, no colored product is obtained.

The method of the present invention can even be carried out at atmospheric pressure and at a temperature of of not more than 80° C appropriately selecting reagents or substituents.

These points will become apparent from the comparison of the method of the present invention for synthesizing hydroxyethoxycinnamic acid starting from hydroxyethoxybenzaldehyde and another method as described hereinbelow, for example, synthesizing hydroxyethoxycinnamic acid where hydroxycinnamic acid is used as a starting material and is subjected to hydroxyethoxization.

In this case, however, there is no appreciable difference in melting point between the starting material, hydroxycinnamic acid (the melting point of te paraform is 214° C and that of the meta-form, 190° C) and the product, hydroxyethoxycinnamic acid (the melting point of the para-form is 190° C), and, thus, in recrystallization, the starting material is liable to separate with the product, thereby making it difficult to separate them.

The use of hydroxyethoxybenzaldehyde as a starting material is greatly different from that of hydroxycinnamic acid, for example, polyoxycinnamate is produced from hydroxycinnamic acid, which has a remarkably high melting point and, thus, is difficult to handle.

On the other hand, hydroxyethoxybenzaldehyde is produced from hydroxybenzaldehyde in high yields and is purified with ease by a simple fractional distillation or a treatment with an aqueous alkali solution.

Furthermore, the reactivity of hydroxyethoxybenzaldehyde and malonic acid, for example, is high, and the product, hydroxyethoxycinnamic acid (the para-form; m.p. = 190° C) has a much higher crystallinity than the starting material, hydroxyethoxybenzaldehyde (the para-form; m.p. = 33.4° C; the meta-form is liquid), and thus purification is very easy. In another method, the reaction between hydroxycinnamic acid and 1,2-dibromoethane, etc., can be used.

The present invention will be illustrated in more detail by the following preparation examples.

PREPARATION EXAMPLE 1

In 50 ml of pyridine were dissolved 0.100 mol of m-hydroxyethoxybenzaldehyde (b.p. 128° C/2 mmHg) and 0.105 mol of malonic acid and the system maintained at 60° to 80° C for 50minutes with occasional stirring.

The mixture was then chilled with ice and added to 5% hydrochloric acid chilled with ice, whereby m-hydroxyethoxycinnamic acid precipitated, which was then separated. The m-hydroxyethoxycinnamic acid was white, and its yield was almost quantitative.

Where monomethyl malonate was used, a colorless liquid was isolated as the product.

PREPARATION EXAMPLE 2

In 0.2 ml of piperidine and 50 ml of pyridine were dissolved 0.10 mol of p-hydroxyethoxybenzaldehyde (m.p. 33°-4° C) and 0.1 mol of malonic acid and the system then maintained at 60°to 80° C for 60 minutes with stirring.

The mixture was then chilled with ice, treated with 5% hydrochloric acid chilled with ice, and recrystalized from ethanol, whereby white crystals were obtained. Their melting point was 190° C.

Where monoethyl malonate or monomethyl malonate was used, pale-yellow solids were isolated as the product.

The thus obtained internal double bond-containing polyester ether materials were subjected to a condensation reaction as they were or after being converted into the ester, amide, acid halide, anhydride, or metal salf form thereof.

Methods of synthesizing polyester ethers are well known, and reaction control, additives, time of adding additives, reagents used, catalysts, removal or reaction products, order of adding additives, temperatures, reaction pressures, etc., are described in detail in patents, reports, and in addition, in the literature. Thus references are substituted for part of the explanation as described herein below.

As described hereinbefore, the present invention is characterized by use of novel starting materials, and it goes without saying, therefore, that those methods well known as condensation methods can be used in the present invention after being subjected to appropriate modifications.

Methods of synthesizing polyesters, additives, processing conditions, etc., are described in detail in the above cited patents, and Takiyama, *Polyester Jushi (Polyester Resins)*, Nikkan Kogyo Shinbun Sha, Tokyo (1972), Akita, *Polyester Jushi (Polyester Resins)*, Kogyo Chosakai, Tokyo (1973), Murahashi et al., *Gosei Kobunshi (Synthetic Polymers)*, V, Asakura Shoten, Tokyo (1971), Korshak, *Polyesters*, Pergamon Press, London (1965), etc.

Since methods of producing polyesters from diols, dicarboxylic acids, acid halides, and the like are, as described above, quite well known, a method using oxyacids will be explained.

Hitherto, several methods of producing polyesters or polyester ethers from compounds containing alcoholic hydroxy groups and aromatic carboxyl groups, e.g., β-hydroxyethylbenzoic acid, β-hydroxyethoxybenzoic acid, and the like have been reported, and these methods can be used. These methods are described in U.S. Pat. Nos. 2,658,055, 2,686,198, 2,692,248, 2,696,481, 2,728,747, 2,789,969, 3,039,994, 3,056,761, 3,179,636, British Pat. Nos. 742,793, 968,390, 985,611, 993,272, 1,032,648, Japanese Pat. Pub. No. 17345/1972, U.S. Pat. Nos. 2,686,198, 2,699,438, P. W. Morgan, *Polymer*, Interscience (1963), Morgan, *Condensation Polymers by Interfacial and Solution Methods*, Interscience, New York (1965), etc.

Simply stated, the polymerization reaction proceeds with ease by heating methylhydroxyalkoxycinnamates in the presence of an ester exchange catalyst.

With regard to the ester interchange catalysts, the amount of catalyst, solvents, reaction temperatures, reaction time, etc., are described in detail in the above cited references.

In carrying out this condensation reaction, diols as are used in conventional polyesterization reactions, e.g., ethylene glycol, butandiol, neopentylene alcohol, diethylene glycol, and the like; alcohol-generating agents, e.g., ethylene carbonate, propylene carbonate, and the like; reactive components such as organic acids, e.g., dimethyl terephthalate, dimethyl sebacate, dimethyl isophthalate, dimethyl adipate, butyl lactone, and the like, and aliphatic polyesters, e.g., polyethylene succinate, polybutylene adipate, polyethylene-butylene maleate, or other polymers; and polymers, e.g., an ethylene-vinyl acetate copolymer, an ethyl acrylate-hydroxyethyl methacrylate copolymer, polybutyl methacrylate, and the like; etc., may be added to the reaction system. Furthermore, antistatic agents, e.g., polyethylene glycol, color protecting agents, e.g., phosphates, catalysts, e.g., antimony trioxide, and other reagents as are used in conventional ester exchange reactions can be, as desired, advantageously used in the present invention.

In the production of these polyesters, in order to provide the properties desired for the polyester, e.g., the desired solubility, melting point, dyeability, heat resistance, crystallinity, cross-linking capability, extensibility, transparency, flexibility, film-forming property, moisture resistance, resistance to deterioration, charging capability, and the like, or properties opposite to these, e.g., antistatic properties, opaqueness, insolubility, hydrophilicity, and the like, various kinds of additives or reagents may be present during reaction or added thereto after reaction.

These additives or reagents include ultraviolet absorbants, fillers, reinforcing agents, coloring agents, polymerization inhibitors, drying agents, matting agents, catalysts, reaction accelerators, release agents, sensitizing agents, plasticizers, antistatic agents, cross-linking agents, monomers, water liberating agents, vulcanizing agents, fire retardants, softeners, glass fibers, and the like as are commonly used in the plastic and fiber fields.

Reagents usable in the present invention include those containing 2 to 3,000 carbon atoms, e.g., diols, polyols, dicarboxylic acids, oxycarboxylic acids, oxycarboxylic acid esters, disulfonic acid halides, diamines, aminoalcohols, diisocyanates, bischloroformate, lactones, lactams, polybutyrolactone, ethylene sebacate, diethylene glycol glutamate, dioxystilbene and the like.

These additives or reagents are well known and many of them are described in detail in the above patents.

Needless to say, these additives and methods of using them are described in U.S. Pat. Nos. 2,460,186, 2,965,613, 3,390,108, 3,426,100, 3,471,441, 3,498,950, 3,775,112, 3,799,915, 3,803,096, Japanese Pat. Nos. 7271/1973, 7872/1973, 33035/1973, 33277/1973, 33278/1973, 39240/1973, 13235/1974, 13237/1974, 13238/1974, etc.

Catalysts, the time of adding catalysts, reaction methods, additives, and the like as described in Japanese Pat. Nos. 7267/1973, 7268/1973, 7269/1973, 7272/1973, 16275/1974, 16545/1974, 17021/1974, 17655/1974, Japanese Pat. Nos. (OPI) 102190/1973, 10833/1974, 28698/1974, 31793/1974, 45150/1974, 54323/1974, 55795/1974, 105896/1974, etc., can be used, depending on the desired product.

In this way, polyester ether-polyureas, polyester ether-polyamides, polyester ether-polyurethanes, and the like can be obtained.

The polyester ethers of the present invention are characterized in that double bonds are present in their main chain represented by the formula —$R_2OArR_3COO$— wherein Ar is an arylene group, $R_2$ is an alkylene group or an oxaalkylene group and $R_3$ is a vinylene group, a butadienylene group or a vinylene or a butadienylene group substituted by one or more groups containing not more than 6 carbon atoms, and it is preferred that the alkylalkoxy group thereof comprises not less than about 10%, preferably not less than about 30%, by weight of the units.

Although a hydroxyalkyl group might be considered as a modification of a hydroxyalkoxy group, p-hydroxyethylcinnamic acid, for example, suffers from the defects in that the production of p-hydroxyethylcinnamic acid is difficult, purification thereof is difficult, and high molecular weight polyesters are produced only with difficulty.

Compounds of the present invention have great advantages in ease of production, purification, and ease of condensation.

The polyester ethers of the present invention contain, as described above, aromatic nuclei with double bonds bonded thereto, and thus they have wide application, for example, as plastics, films, fibers, dielectric materials, and the like, as which common aromatic polyesters are used, as recording materials, rubbers, flame-retardant plastics, laser-sensitive materials, molding materials, polarizing film, high density plastics, insoluble materials, paints, light-sensitive materials, and the like produced by isomerization, cross-linking, exposure, graft polymerization, bromination, epoxidization, amine addition, vulcanization, and the like, in which a double bond is involved.

The present invention will be explained by several examples in which a compound of the present invention is used in a recording material. Where these polyester ethers of the present invention are used as photopolymerizable polymer compounds, it is convenient, for handling, that their inherent viscosities range from about 0.05 to about 0.6, particularly about 0.1 to about 0.3. Where the viscosity is excessively low, a film is formed only with difficulty, whereas where the viscosity is excessively high, the product is brittle, thereby having reduced solubility.

Where the polyester ethers are used for recording materials, compounds known as sensitizing agents for cinnamate type polymers, e.g., aromatic ketones, aromatic quinones, nitro compounds, pyrylium salts, and the like can be used. These compounds are well-known and can selected from those compounds described in U.S. Pat. Nos. 3,575,929, 3,582,327, 3,647,470. 3,721,566, 3,726,685, 3,737,314, 3,772,027, or 3,787,212, e.g., Michler's ketone, trinitroflourene, tetranitrocarbazole, benzanthrone, phenanthrenequinone, hexylbenzoin, benzomethylene-N-benzyl-$\beta$-napthothiazoline, 2-(4-dimethylaminophenyl)-phenanthio-(9,10)-4,5-oxazole, 4-(4-amyloxyphenyl)-2,4-diphenylpyrylium perchlorate, and the like. These compounds are conveniently used in an amount of about 0.1 to about 15% by weight based on the polyester ethers.

Where the polyester ethers are used for recording materials, various methods, additives, stabilizers, coloring agents, plasticizers, cross-linkable monomers, antistatic agents, resins, matting agents, undercoating layers, protective layers and the like as are well known in this art can be used. Such materials are described in U.S. Pat. Nos. 3,707,373, 3,775,112, Japanese Pat. Nos. (OPI) 109106/1974, 38163/1974, etc. In addition, it goes without saying that those methods in which a polyolefin layer is coated on the surface of a resin layer and the light-sensitive layer is heated at 40° to about 70° C at exposure, etc., can be used to protect the recording layer or to promote photocrosslinkability.

Typically, ester interchange is conducted at atmospheric pressure to obtain a polymer and then a vacuum is applied to the system. With a low molecular weight polymer mixture, the system is not highly viscous and by-products such as alcohols are easily removed from the system. As the length of the polymer chain involved increases, the viscosity of the system increases and by-products cannot be easily be removed from the system. In this situation, a vacuum is applied to remove by-products present which cannot easily be removed from the system and to assist in permitting the polymer chain length to be further increased.

EXAMPLE 1

0.1 mol of methyl p-β-hydroxyethoxycinnamate and 0.2 mol of methyl hydroxyethoxybenzoate were heated at 160° C to 200° C for 4 hours in a nitrogen gas atmosphere in the presence of isopropyl titanate as a catalyst to remove the methanol. The thus obtained product was coated on an aluminum plate which had been electrolyzed to form an $Al_2O_3$ film thereon together with 5 wt% tetranitrocarbazole which had been added thereto to a dry thickness of about 2 μ. The thus obtained material had good light-sensitivity. That is, upon irradiating with a 450 w high voltage mercury lamp for about 1 minute, the exposed areas became insoluble in any solvent.
* amount: 300 mg.

EXAMPLE 2

0.1 mol of hydroxyethoxycinnamic acid obtained as above was reacted with about 1.05 equivalent (molar) of thionyl chloride in a mixed solvent of 50 ml of benzene and 3 ml of dimethylformamide to produce hydroxyethoxycinnamic acid halide which had an irritating odor. Without isolation, the acid halide was treated with about 4 mol equivalents of a mixed solvent* of pyridine and trichlene to produce a polyester.
* Pyridine : trichlene→vol ratio 4:1

Likewise, dissolving the acid halide in 50 ml of methyl ethyl ketone in place of pyridine and trichlene, followed by interfacial polymerization (by the Schotten-Baumann process) using a 10% by weight solution of sodium hydroxide in water at −15° C gave the polyester.

In the case of producing the above acid halide, the amount of dimethylformamide was changed to about 20 ml and the temperature was set at 95° C, whereby the polyester was obtained.

In addition, reacting the acid halide with butylenediamine-1,4 and hexamethylenediisocyanate, in this order, a polyamide and a polyurethane were obtained.

Alternatively, polyesters containing acid halide groups as terminal groups can be produced from hydroxyalkoxycinnamic acid halides, and the polyesters so produced then treated with active hydrogen-containing compounds, e.g., alcohols, phenols, polyethylene glycol monobutyl ether, aniline phenylhydrazine, thiophenols, and the like.

EXAMPLE 3

In accordance with the method described in U.S. Pat. No. 3,726,685, 0.1 mol of methyl m-hydroxyethoxycinnamte, 0.05 mol of methyl p-hydroxyethoxycinnamate, and 0.1 mol of methyl hydroxyethoxyphenyl acetate were polycondensed in isopropyl titanate* as a ctalyst to produce a polyester. The polyester had excellent photocurability, i.e., a light-sensitive material produced by coating the above polyester resin containing 8% by weight of 2-benzoylmethylene-1-methyl-β-naphthothiazoline dissolved in cellosolve as a solvent on an aluminum plate (electrolyzed to form a thin $Al_2O_3$ film thereon) to a dry thickness of about 3 μ could be used as a good printing plate after a conventional exposure and development as described in, for example, U.S. Pat. Nos. 3,575,929, 3,582,327, 3,647,470, 3,721,566, 3,726,685, 3,737,314, 3,772,027, and 3,787,212, with representative developing solutions being disclosed in U.S. Pat. Nos. 3,703,373 and 3,677,763.
(* amount : 400 mg)

EXAMPLE 4

In a round bottle, three necked flask equipped with a condenser and a stirrer were placed 0.3 mol of methyl p-β-hydroxyethoxycinnamate, 0.05 mol of diisoamyl azelate, 0.15 mol of pentanediol, 0.2 mol of cyclohexanedimethanol, and 0.2 mol of ethylene glycol.

This reaction mass was maintained at 200° C for 10 minutes while bubbling nitrogen gas therethrough with stirring. A 20% solution of isopropyl titanate in butanol was added in an amount of 1 ml as a catalyst, and the ester exchange reaction proceeded for about 5 hours. The reaction mass was then heated to 230° C under a pressure of 1 mmHg to remove a distillate. After 2 hours, a polyester ether having an inherent viscosity of 0.43 was obtained quantitatively.

EXAMPLE 5

The same procedure as described above was carried out using 0.3 mol of ethyl m-β-hydroxyethoxycinnamate and 0.3 mol of ethyl p-β-hydroxyethoxycinnamate, i.e., after heating to 200° C, three drops of isopropyl titanate were added, and the reaction mass was maintained at that temperature for 6 hours. Then, the reaction mass was maintained at a reduced pressure of 2 mmHg for 110 minutes with stirring. The polyester ether obtained had an inherent viscosity of 0.56.

This polyester had excellect photocurability.

REFERENCE EXAMPLE 1

On an aluminum plate as in Examples 3 was coated a photocrosslinkable composition in which 2-benzoylmethylene-1-methyl-β-naphthothiazoline was added to the polyester of Example 4 in an amount of 8% by weight based on the polyester. The dry thickness of the coating was about 3 μ.

The material so produced was exposed to light through a line image manuscript with a 450 w high voltage mercury lamp as a light source at a distance of about 30 cm for 2 seconds. Exposed areas became insoluble in organic solvents such as cellosolve, cellosolve acetate, and the like.

Likewise, where methyl N-methyl-benzothiazolidene thioacetate was added in an amount of 0.5% by weight based on the polyester of Example 5, good photocrosslinking resulted.

While the invention has been described in detail and with reference to specific embodiments thereof, it will be apparent to one skilled in the art that various changes and modifications can be made therein without departing from the spirit and scope thereof.

What is claimed is:

1. A polyester ether having high molecular weight and film or fiber forming properties containing in its main chain the moiety represented by the formula:

$$-R_2OArR_3COO-$$

wherein Ar is arylene, $R_2$ is alkylene or oxaalkylene and $R_3$ is vinylene, butadienylene, or vinylene or butadienylene substituted by a group containing 6 or less carbon atoms.

2. A polyester ether according to claim 1, wherein the moiety represented by the above formula constitutes not less than 10% by weight of the polymer.

3. A polyester ether according to claim 1, wherein the formula is:

$$-R_2OArCH=CH-COO-$$

4. A polyester ether according to claim 1, wherein Ar is:

wherein $R_5$ and $R_6$ are those groups whose total carbon atom number is not more than 12 and wherein $R_5$ and $R_6$ may combine with each other to form a 5- or 6-membered ring.

5. A light-sensitive composition containing the polyester ether of claim 1 in combination with an amount of a sensitizing agent effective to render the combination light-sensitive.

6. A polyester ether according to claim 1, wherein the moiety is:

wherein $n$ is 2, 3 or 4.

7. A polyester ether according to claim 6, wherein the moiety represented by the above formula constitutes not less than 30% by weight of the polymer.

8. A polyester ether according to claim 1, which has an inherent viscosity from about 0.05 to about 0.6.

9. A polyester ether according to claim 8, wherein said polyester ether has an inherent viscosity from about 0.1 to about 0.3.

10. A light-sensitive material comprising a support having thereon a layer comprising a polyester ether having high molecular weight and film or fiber-forming properties containing in its main chain the moiety represented by the formula:

$$-R_2OArR_3COO-$$

wherein Ar is arylene, $R_2$ is alkylene or oxaalkylene and $R_3$ is vinylene, butadienylene, or vinylene or butadienylene substituted by a group containing 6 or less carbon atoms, and an effective amount of a sensitizing agent to render the composition light-sensitive.

11. A light-sensitive composition according to claim 5, wherein said sensitizer is present in an amount of about 0.1 to bout 15% by weight based on the polyester ether.

12. A light-sensitive material according to claim 10, wherein said sensitizer is present in an amount of about 0.1 to about 15% by weight based on the polyester ether.

* * * * *